(12) United States Patent
Pan et al.

(10) Patent No.: US 7,127,314 B2
(45) Date of Patent: Oct. 24, 2006

(54) FABRICATION MONITORING SYSTEM

(75) Inventors: Chin-Cheng Pan, Hsin-Chu (TW);
Chao-Fan Chang, Hsin-Chu (TW);
Pai-Cheng Huang, Hsin-Chu (TW);
Oliver Wu, Miao-Li (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 393 days.

(21) Appl. No.: 10/811,087

(22) Filed: Mar. 25, 2004

(65) Prior Publication Data

US 2005/0216113 A1    Sep. 29, 2005

(51) Int. Cl.
*G06F 19/00* (2006.01)
(52) U.S. Cl. ........................... 700/108; 700/30
(58) Field of Classification Search ............ 700/28–31, 700/97, 100–102, 108, 111; 705/7–11
See application file for complete search history.

(56) References Cited

U.S. PATENT DOCUMENTS

| | | | | |
|---|---|---|---|---|
| 5,884,300 | A * | 3/1999 | Brockman | 707/2 |
| 6,078,893 | A * | 6/2000 | Ouimet et al. | 705/10 |
| 6,226,561 | B1 * | 5/2001 | Tamaki et al. | 700/100 |
| 6,272,389 | B1 * | 8/2001 | Dietrich | 700/101 |
| 6,311,094 | B1 * | 10/2001 | Iriuchijima et al. | 700/100 |
| 6,415,260 | B1 * | 7/2002 | Yang et al. | 705/10 |
| 6,725,122 | B1 * | 4/2004 | Mori et al. | 700/121 |
| 7,039,595 | B1 * | 5/2006 | Lilly et al. | 705/8 |
| 7,050,879 | B1 * | 5/2006 | Wang et al. | 700/121 |
| 2002/0107720 | A1 * | 8/2002 | Martin | 705/10 |
| 2002/0156548 | A1 | 10/2002 | Arackaparambil et al. | |
| 2002/0169657 | A1 * | 11/2002 | Singh et al. | 705/10 |
| 2002/0169842 | A1 | 11/2002 | Christensen et al. | |
| 2003/0050869 | A1 | 3/2003 | Bruynsteen | |
| 2003/0061123 | A1 | 3/2003 | McMenimen et al. | |
| 2003/0126103 | A1 * | 7/2003 | Chen et al. | 706/50 |
| 2003/0208389 | A1 * | 11/2003 | Kurihara et al. | 705/7 |

* cited by examiner

*Primary Examiner*—Maria N. Von Buhr
(74) *Attorney, Agent, or Firm*—Slater & Matsil, L.L.P.

(57) ABSTRACT

System and method for monitoring a fabrication process. Generally, an actual-to-planned variance is calculated by determining a daily part index as a percentage of the delta between the planned quantity and the actual quantity over the planned quantity. A weekly part index is calculated by averaging the daily part index over a predetermined time period. From the weekly part index, a site index is determined that takes into account products fabricated at a particular site. Furthermore, a planned-to-actual variance may be calculated by determining a daily part index as a percentage of the delta between the planned quantity and the actual quantity over the actual quantity. A weekly part index is calculated by averaging the daily part index over a predetermined time period. From the weekly part index, a site index is determined that takes into account products fabricated at a particular site.

36 Claims, 2 Drawing Sheets

FABRICATION MONITORING SYSTEM

TECHNICAL FIELD

The present invention relates generally to manufacturing systems, and more particularly to a system and method for monitoring the performance of a manufacturing system.

BACKGROUND

In many fabricating processes, plans are generated that estimate the quantity of a product that may be fabricated by a specific date. The plans are used by multiple organizations to plan and monitor the work flow in each respective area. For example, fabricating semiconductor chips generally involves fabricating wafers and performing tests on the wafers or individual die. A fabrication plan is created to estimate the fabrication schedule and quantities of semiconductor chips that may be fabricated within a given time frame or on a specific date.

The fabrication plan is utilized by a test organization to generate a testing plan. The testing plan generally takes as input the quantity of wafers expected to be fabricated on a specific date and determines the quantity of wafers that are to be tested on each day. As indicated above, the testing plan is very dependent upon the fabrication plan.

Many times, however, the plans are not accurate. Large variances between the planned and actual values may have a significant impact on successive systems and processes. For example, if the fabrication plan over estimates the quantity of wafers produced on a specific date, then the testing system may have idle equipment or workers that could be used for another task. Similarly, if the fabrication plan under estimates the quantity of wafers produced on a specific date, then the testing system may not have sufficient equipment and/or workers available to process the quantity provided by fabrication in a satisfactory time frame.

Therefore, there is a need for monitoring manufacturing systems to measure the accuracy of the fabrication plans such that the fabrication plans may be updated to produce more accurate plans.

SUMMARY OF THE INVENTION

These and other problems are generally solved or circumvented, and technical advantages are generally achieved, by preferred embodiments of the present invention which provides a method and apparatus for monitoring fabrication systems and determining the accuracy of the related planning systems.

One embodiment of the present invention determines a delta-to-planned variance. A daily part index may be calculated as the delta between the planned quantity and the actual quantity for a product p on a date t by the planned quantity. A weekly part index may be calculated based at least in part on the daily part index. From the weekly part index, a site index may be calculated.

In another embodiment of the present invention, a delta-to-actual variance is determined. A daily part index may be calculated as the delta between the planned quantity and the actual quantity for a product p on a date t divided by the actual quantity. A weekly part index may be calculated based at least in part on the daily part index. From the weekly part index, a site index may be calculated.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor fabrication plant. The invention may also be applied, however, to other manufacturing facilities wherein it would be useful to measure the planned-to-actual performance and/or the actual-to-planned performance of a fabrication process. One use of these measurements is to further optimize the planning process such that a more accurate plan may be developed. Another use of these measurements is to gain a better estimate of the quantities of a product that downstream processes, such as testing, may expect.

It is noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
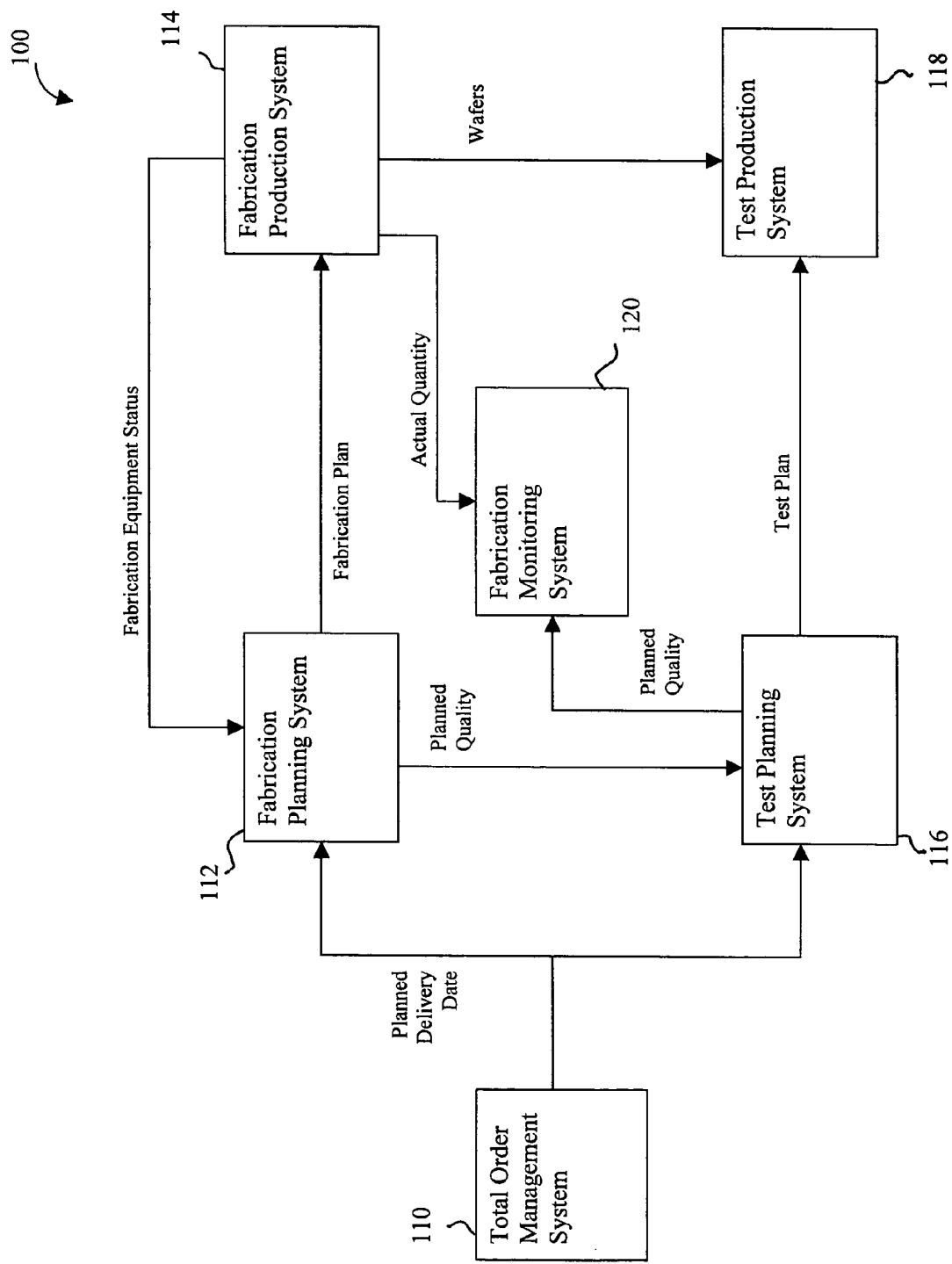
FIG. 1 is a diagram of a semiconductor wafer fabrication monitoring system in accordance with an embodiment of the present invention.

Referring now to FIG. 1, reference numeral 100 designates a functional block diagram embodying features of one embodiment of the present invention. Each of the functional blocks identified in FIG. 1 may be separate independent systems, one or more networked systems, or may be combined into a single system. The functional block diagram 100 comprises a total order management (TOM) system 110, a fabrication planning system 112, a fabrication production system 114, a test planning system 116, a test production system 118, and a fabrication monitoring system 120.

The total order management system 110 provides an interface for entering order information in the production process. The information pertaining to the order is provided to the fabrication planning system 112 and the test planning system 116. For example, the total order management system 110 may provide the fabrication planning system 112 and the test planning system 116 a planned delivery date as illustrated in FIG. 1. The fabrication planning system 112 and the test planning system 116 utilize the planned delivery date to generate a fabrication plan and a test plan, respectively, to meet the planned delivery date. Other information may be generated by the total order management system 110 and transmitted to the fabrication planning system 112 and/or the test planning system 116.

The fabrication planning system 112 utilizes the planned delivery date and fabrication facilities information, such as, for example, past fabrication results, fabrication line equipment conditions, fabrication tool down notifications, resource shortage notifications, and the like, to generate a fabrication plan. The fabrication plan may include, for example, an identification of the equipment used and parts manufactured, resources needed, a fabrication schedule, and the like. The fabrication production system 114 executes the fabrication plan. As discussed above, the results of the fabrication production system 114 may be used by the fabrication planning system 112 to further refine the fabrication plan.

The test planning system 116 utilizes the planned delivery date to generate a test plan. Additionally, the test planning system 116 utilizes a planned quantity, which may be calculated by the test planning system 116 or received from the fabrication planning system 112. In the preferred embodiment, however, the planned quantity is determined by the fabrication planning system 112 and provided to the test planning system, thereby ensuring that the same planned quantity values are used by the fabrication planning system 112 and the test planning system 116.

The test plan is provided to the test production system 118, which is responsible for executing the test plan. The test production system 118 receives fabricated wafers from the fabrication production system 114, upon which tests are to be performed. The quantity of wafers provided by the fabrication production system 114 may be dependent upon the customer requirements and the quantity of wafers actually produced by the fabrication production system 114. For example, many times the customers specify the quantity of wafers the customer requires to undergo specific tests, such as circuit probe (CP) testing. Alternatively, the quantity of wafers provided by the fabrication system 114 may be a fixed percentage of the quantity of wafers produced or some other quantity.

Frequently, the quantity of wafers actually produced varies from the quantity planned for production. Additionally, often times the planning methods used by the test planning system 116 and the fabrication planning system 112 are different, thereby possibly generating different estimates of the quantity of wafers that may be available for testing. Accordingly, it is preferred that the fabrication monitoring system 120 determine a planned-to-actual variance and an actual-to-planned variance of the quantity of wafers actually produced and available for testing.

The fabrication monitoring system 120 utilizes the actual quantity produced by the fabrication production system 114 and the planned quantity to be produced. The planned quantity to be produced may be obtained from either the fabrication planning system 112, which function is generally responsible for generating the planned quantity, or from the test planning system 116, which frequently utilizes the planned quantity for generating a test plan. In FIG. 1, the planned quantity is shown as being provided by the test planning system for illustrative purposes only.

Figure 2:
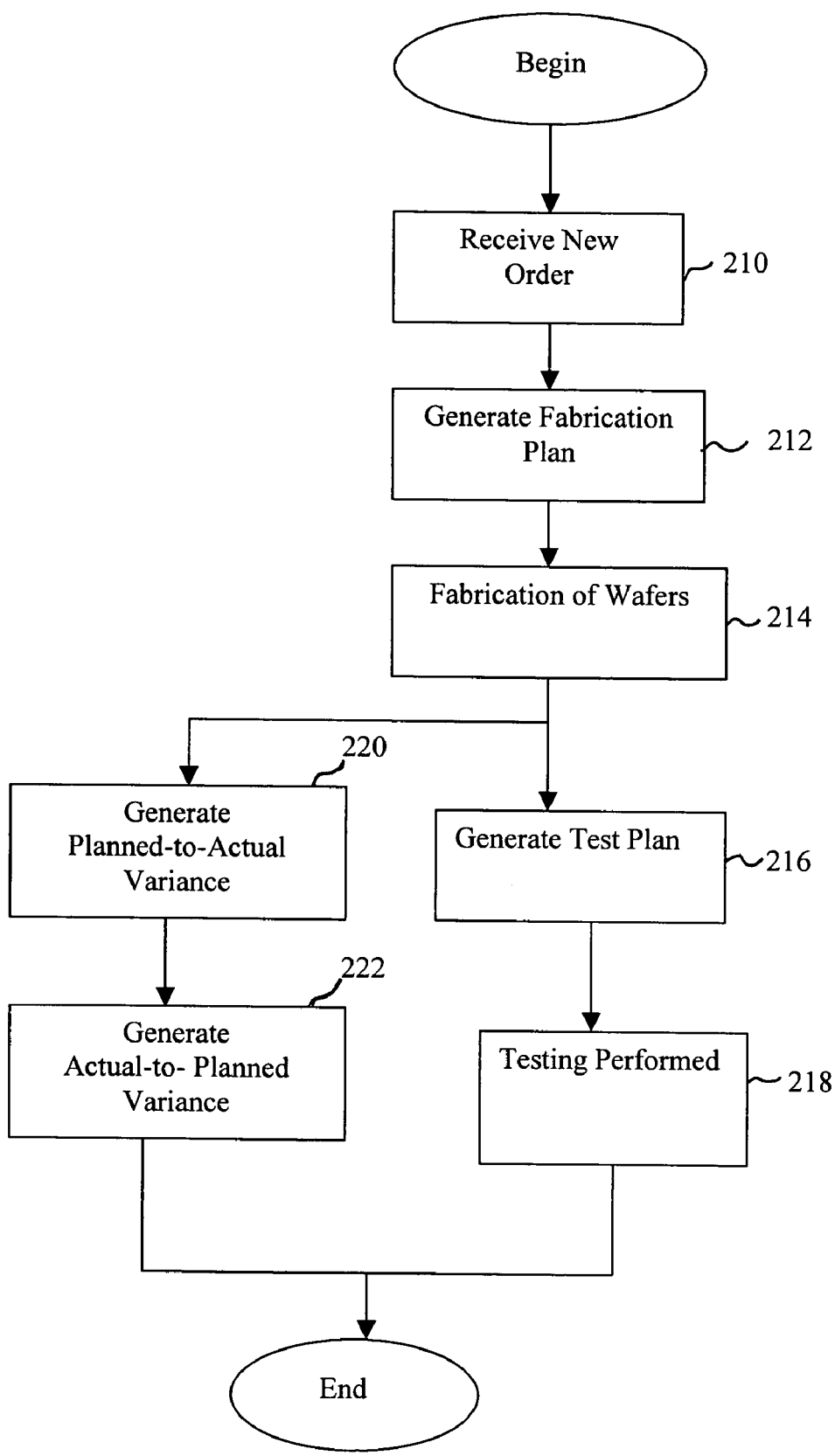
FIG. 2 is a diagram of a semiconductor wafer fabrication monitoring system wherein the existence of faulty dice is determined in accordance with an embodiment of the present invention.

FIG. 2 is a data flow diagram depicting the steps that may be performed by the fabrication monitoring system 120 to monitor the fabrication system in accordance with one embodiment of the present invention. The process begins in step 210, wherein a new order is received. As discussed above, a new order is preferably generated via the total order management system 110 (FIG. 1) and the planned delivery date is provided to the fabrication planning system 112 (FIG. 1) and the test planning system 116 (FIG. 1). In step 212, a fabrication plan is generated by the fabrication planning system 112 and provided to the fabrication production system 114 (FIG. 1). In step 214, the fabrication of the wafers is performed.

In step 216, a test plan is generated by the test planning system 116 based upon the delivery date and the planned quantity of wafers to be fabricated. Testing is performed by the testing production system 118 in step 218.

After the fabrication process is complete in step 214, the fabrication monitoring steps may be performed. As will be described in greater detail below, a delta-to-actual variance is calculated in step 220 and an delta-to-planned variance is calculated in step 222.

Regarding step 220, it is preferred that the delta-to-planned variance be determined by calculating a daily part index, a weekly index, and a site index. Preferably, the daily part index is determined as a percentage of the delta between the planned quantity and the actual quantity to the planned quantity for a given part p on a given date t. The daily part index may be used to calculate a weekly part index by averaging the daily part indexes. The site index is determined for a particular fabrication site f for a given product p based upon the weekly part index.

One equation that may be used to calculate the daily part index in accordance with one embodiment of the present invention is identified by Equation 1.

$$PI_{D(p,t)} = \left[1 - \frac{\max\left[\left(\sum_{k=-1}^{1} PQ_{(p,t+k-7)} - \sum_{k=-1}^{1} AQ_{(p,t+k)}\right), 0\right]}{\sum_{k=-1}^{1} PQ_{(p,t+k-7)}}\right] \times 100\%,$$ (Equation 1)

wherein $PI_{D(p,t)}$ is the daily part index of date t for product p;

t is the date for which the daily part index is being calculated;

p is the product for which the daily part index is being calculated;

$PQ_{(p,t+k-7)}$ is the wafer out quantity sum of product p which is planned to be finished on one week previous of date t, i.e., (t−7) according to the production plan; and $AQ_{(p,t+k)}$ is the wafer out quantity sum of product p which is actually finished in date t.

It should be noted that it is preferred that the values for the planned quantity (PQ) are the values determined for the week prior to the date from which the actual quantity (AQ) are taken. In an alternative embodiment, however, the values for the planned quantity and the actual quantity may be taken from different dates or the same date.

From the daily part index ($PI_{D(p,t)}$), a weekly part index may be calculated for a product p on a given date t. One equation that may be used to calculate the part index in accordance with one embodiment of the present invention is identified by Equation 2.

$$PI_{Wp} = \sum_{t=1}^{tm} \frac{PI_{D(p,t)}}{m}, \quad \text{(Equation 2)}$$

wherein $PI_{Wp}$ is the weekly part index for product p;

p is the product for which the weekly part index is being calculated;

t is the date for which the weekly part index is being calculated;

$PI_{D(p,t)}$ is the daily part index of date t for product p; and m is the number of days in one week for which $PI_{D(p,t)}$ is valid.

Preferably, the daily part index $PI_{D(p,t)}$ is considered valid whenever the planned quantity for the product p on date t is a positive value. In other words, $PI_{D(p,t)}$ is valid where $$\sum_{k=-1}^{1} PQ_{(p,t+k)} \rangle 0.$$

A site index may be calculated based upon the planned quantity and the weekly part index. One equation that may be used to calculate the site index in accordance with one embodiment of the present invention is identified by Equation 3.

$$SI_{Wf} \% = \frac{\sum_{t=1}^{m} PQ_{(p,t)} \times PI_{Wp} \%}{\sum_{t=1}^{m} PQ_{(p,t)}}, \quad \text{(Equation 3)}$$

wherein $SI_{Wf}\%$ is the site index for week W and fabrication site f, $PQ_{(p,t)}$ is the wafer out quantity sum of product p that is planned to be finished on dates t on which $PQ_{(p,t)}$ is valid; and $PI_{Wp}$ is the weekly part index for product p.

Preferably, $PQ_{(p,t)}$ is considered valid whenever the planned quantity for the product p on date t is a positive value. In other words, $PQ_{(p,t)}$ is valid for date t and product p if ($PQ_{(p,t)}>0$).

Regarding step 222 it is preferred that the delta-to-actual variance be determined by calculating a daily part index, a weekly part index, and a site index. Preferably, the daily part index is determined as a percentage of the delta between the planned quantity and the actual quantity to the actual quantity for a given product p on a given date t. The daily part index may be used to calculate a weekly part index by averaging the daily part indexes. The site index is determined for a particular fabrication site f for a given product p based upon the weekly part index.

One equation that may be used to calculate the daily part index in accordance with one embodiment of the present invention is identified by Equation 4.

$$PI_{D(p,t)} = \left[1 - \frac{\max\left[\left(\sum_{k=-1}^{1} PQ_{(p,t+k-7)} - \sum_{k=-1}^{1} AQ_{(p,t+k)}\right), 0\right]}{\sum_{k=-1}^{1} AQ_{(p,t+k)}}\right] \times 100\%, \quad \text{(Equation 4)}$$

wherein $PI_{D(p,t)}$ is the daily part index of date t for product p;

t is the date for which the daily part index is being calculated;

p is the product for which the daily part index is being calculated;

$PQ_{(p,t+k-7)}$ is the wafer out quantity sum of product p which is planned to be finished on one week previous of date t, i.e., (t−7) according to the production plan; and $AQ_{(p,t+k)}$ is the wafer out quantity sum of product p which is actually finished in date t.

It should noted that it is preferred that the values for the planned quantity (PQ) are the values determined for the week prior to the date from which the actual quantity (AQ) are taken. In an alternative embodiment, however, the values for the planned quantity and the actual quantity may be taken from different dates or the same date.

From the daily part index ($PI_{D(p,t)}$), a weekly part index may be calculated for a product p on a given date t. One equation that may be used to calculate the weekly part index in accordance with one embodiment of the present invention is identified by Equation 5.

$$PI_{Wp} = \sum_{t=1}^{tm} \frac{PI_{D(p,t)}}{m}, \quad \text{(Equation 5)}$$

wherein $PI_{Wp}$ is the weekly part index for product p;

p is the product for which the weekly part index is being calculated;

t is the date for which the weekly part index is being calculated;

$PI_{D(p,t)}$ is the daily part index of date t for product p; and m is the number of days in one week for which $PI_{D(p,t)}$ is valid.

Preferably, the daily part index $PI_{D(p,t)}$ is considered valid whenever the planned quantity for the product p on date t is a positive value. In other words, $PI_{D(p,t)}$ is valid where $$\sum_{k=-1}^{1} PQ_{(p,t+k)} \rangle 0.$$

A site index may be calculated based upon the planned quantity and the weekly part index. One equation that may be used to calculate the site index in accordance with one embodiment of the present invention is identified by Equation 6.

$$SI_{Wf}\ \% = \frac{\sum_{t=1}^{m} AQ_{(p,t)} \times PI_{Wp}\ \%}{\sum_{t=1}^{m} AQ_{(p,t)}},$$ (Equation 6)

wherein $SI_{Wf}\%$ is the site index for week W and fabrication site f;

$AQ_{(p,t)}$ is the wafer out quantity sum of product p that is actually finished on dates t on which $PQ_{(p,t)}$ is valid; and $PI_{Wp}$ is the weekly part index for product p.

Preferably, $PQ_{(p,t)}$ is considered valid whenever the planned quantity for the product p on date t is a positive value. In other words, $PQ_{(p,t)}$ is valid for date t and product p if $(PQ_{(p,t)} > 0)$.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of monitoring fabrication performance, the method comprising:
   calculating a planned quantity as an expected value that is to be fabricated on a first date in accordance with a production plan;
   calculating an actual quantity as an actual value that is fabricated on a second date; and
   calculating a daily part index, wherein the daily part index represents a delta between the planned quantity and the actual quantity divided by the planned quantity.

2. The method of claim 1, wherein planned quantity values are determined for a date previous to a date corresponding to the actual quantity.

3. The method of claim 1, wherein the daily part index is determined in accordance with the equation:

$$PI_{D(p,t)} = \left[ 1 - \frac{\max\left[\left(\sum_{k=-1}^{1} PQ_{(p,t+k-7)} - \sum_{k=-1}^{1} AQ_{(p,t+k)}\right), 0\right]}{\sum_{k=-1}^{1} PQ_{(p,t+k-7)}} \right] \times 100\%,$$

wherein $PI_{D(p,t)}$ is the daily part index of date t for product p;
t is the date for which the daily part index is being calculated;
p is the product for which the daily part index is being calculated;
$PQ_{(p,t+k-7)}$ is the wafer out quantity sum of product p which is planned to be finished on one week previous of date t according to the production plan; and
$AQ_{(p,t+k)}$ is the wafer out quantity sum of product p which is actually finished in date t.

4. The method of claim 1, further including the step of determining a weekly part index based at least in part on the daily part index.

5. The method of claim 4, wherein only daily part index values greater than a first value are used to calculate the weekly part index.

6. The method of claim 4, wherein the weekly part index is calculated in accordance with the equation:

$$PI_{Wp} = \sum_{t=1}^{Tm} \frac{PI_{D(p,t)}}{m},$$

wherein $PI_{Wp}$ is the weekly part index for product p;
p is the product for which the weekly part index is being calculated;
t is the date for which the weekly part index is being calculated;
$PI_{D(p,t)}$ is the daily part index of date t for product p; and
m is the number of days in one week for which $PI_{D(p,t)}$ is valid.

7. The method of claim 4, further including the step of determining a site index based at least in part on the weekly part index.

8. The method of claim 7, wherein the site index is calculated in accordance with the equation:

$$SI_{Wf}\ \% = \frac{\sum_{t=1}^{m} PQ_{(p,t)} \times PI_{Wp}\ \%}{\sum_{t=1}^{m} PQ_{(p,t)}},$$

wherein $SI_{Wf}\%$ is the site index for week W and fabrication site f;
$PQ_{(p,t)}$ is the wafer out quantity sum of product p that is planned to be finished on dates t on which $PQ_{(p,t)}$ is valid; and
$PI_{Wp}$ is the weekly part index for product p.

9. The method of claim 1, wherein the first date is the same date as the second date.

10. A method of monitoring fabrication performance, the method comprising:
    calculating a planned quantity as an expected value that is to be fabricated on a first date in accordance with a production plan;
    calculating an actual quantity as an actual value that is fabricated on a second date; and
    calculating a daily part index, wherein the daily part index represents a delta between the planned quantity and the actual quantity divided by the actual quantity.

11. The method of claim 10, wherein planned quantity values are determined for a date previous to a date corresponding to the actual quantity.

12. The method of claim 10, wherein the daily part index is determined in accordance with the equation:

$$PI_{D(p,t)} = \left[1 - \frac{\max\left[\left(\sum_{k=-1}^{1} PQ_{(p,t+k-7)} - \sum_{k=-1}^{1} AQ_{(p,t+k)}\right), 0\right]}{\sum_{k=-1}^{1} AQ_{(p,t+k)}}\right] \times 100\%,$$

wherein $PI_{D(p,t)}$ is the daily part index of date t for product p;

t is the date for which the daily part index is being calculated;

p is the product for which the daily part index is being calculated;

$PQ_{(p,t+k-7)}$ is the wafer out quantity sum of product p which is planned to be finished on one week previous of date t according to the production plan; and $AQ_{(p,t+k)}$ is the wafer out quantity sum of product p which is actually finished in date t.

13. The method of claim 10, further including the step of determining a weekly part index based at least in part on the daily part index.

14. The method of claim 13, wherein only daily part index values greater than a first value are used to calculate the weekly part index.

15. The method of claim 13, wherein the weekly part index is calculated in accordance with the equation:

$$PI_{Wp} = \sum_{t=1}^{tm} \frac{PI_{D(p,t)}}{m},$$

wherein $PI_{Wp}$ is the weekly part index for product p;

p is the product for which the weekly part index is being calculated;

t is the date for which the weekly part index is being calculated;

$PI_{D(p,t)}$ is the daily part index of date t for product p; and m is the number of days in one week for which $PI_{D(p,t)}$ is valid.

16. The method of claim 13, further including the step of determining a site index based at least in part on the weekly part index.

17. The method of claim 16, wherein the site index is calculated in accordance with the equation:

$$SI_{Wf}\% = \frac{\sum_{t=1}^{m} AQ_{(p,t)} \times PI_{Wp}\%}{\sum_{t=1}^{m} AQ_{(p,t)}},$$

wherein $SI_{Wf}\%$ is the site index for week W and fabrication site f;

$AQ_{(p,t)}$ is the wafer out quantity sum of product p that is actually finished on dates t on which $PQ_{(p,t)}$ is valid; and $PI_{Wp}$ is the weekly part index for product p.

18. The method of claim 10, wherein the first date is the same date as the second date.

19. A computer program product for providing a method of monitoring fabrication performance, the computer program product having a medium with a computer program embodied thereon, the computer program comprising computer program code for calculating a planned quantity as an expected value that is to be fabricated on a first date in accordance with a production plan;

computer program code for calculating an actual quantity as an actual value that is fabricated on a second date; and computer program code for calculating a daily part index, wherein the daily part index represents a delta between the planned quantity and the actual quantity divided by the planned quantity.

20. The computer program product of claim 19, wherein the computer program code for calculating the planned quantity determines the planned quantity for a date previous to a date corresponding to the actual quantity.

21. The computer program product of claim 19, wherein the computer program code for calculating the daily part index determines the daily part index in accordance with the equation:

$$PI_{D(p,t)} = \left[1 - \frac{\max\left[\left(\sum_{k=-1}^{1} PQ_{(p,t+k-7)} - \sum_{k=-1}^{1} AQ_{(p,t+k)}\right), 0\right]}{\sum_{k=-1}^{1} PQ_{(p,t+k-7)}}\right] \times 100\%,$$

wherein $PI_{D(p,t)}$ is the daily part index of date t for product p;

t is the date for which the daily part index is being calculated;

p is the product for which the daily part index is being calculated;

$PQ_{(p,t+k-7)}$ is the wafer out quantity sum of product p which is planned to be finished on one week previous of date t according to the production plan; and $AQ_{(p,t+k)}$ is the wafer out quantity sum of product p which is actually finished in date t.

22. The computer program product of claim 19, further including computer program code for determining a weekly part index based at least in part on the daily part index.

23. The computer program product of claim 22, wherein only daily part index values greater than a first value are used to calculate the weekly part index.

24. The computer program product of claim 22, wherein the computer program code for calculating the weekly part index determines the weekly part index in accordance with the equation:

$$PI_{Wp} = \sum_{t=1}^{tm} \frac{PI_{D(p,t)}}{m},$$

wherein $PI_{Wp}$ is the weekly part index for product p;

p is the product for which the weekly part index is being calculated;

t is the date for which the weekly part index is being calculated;

$PI_{D(p,t)}$ is the daily part index of date t for product p; and m is the number of days in one week for which $PI_{D(p,t)}$ is valid.

25. The computer program product of claim 22, further including computer program code for determining a site index based at least in part on the weekly part index.

26. The computer program product of claim 25, wherein the computer program code for determining the site index determines the site index in accordance with the equation:

$$SI_{wf} \% = \frac{\sum_{t=1}^{m} PQ_{(p,t)} \times PI_{W_p} \%}{\sum_{t=1}^{m} PQ_{(p,t)}},$$

wherein
$SI_{wf}\%$ is the site index for week W and fabrication site f;
$PQ_{(p,t)}$ is the wafer out quantity sum of product p that is planned to be finished on dates t on which $PQ_{(p,t)}$ is valid; and
$PI_{W_p}$ is the weekly part index for product p.

27. The computer program product of claim 19, wherein the first date is the same date as the second date.

28. A computer program product for providing a method of monitoring fabrication performance, the computer program product having a medium with a computer program embodied thereon, the computer program comprising
computer program code for calculating a planned quantity as an expected value that is to be fabricated on a first date in accordance with a production plan;
computer program code for calculating an actual quantity as an actual value that is fabricated on a second date; and
computer program code for calculating a daily part index, wherein the daily part index represents a delta between the planned quantity and the actual quantity divided by the actual quantity.

29. The computer program product of claim 28, wherein the computer program code for calculating the planned quantity determines the planned quantity for a date previous to a date corresponding to the actual quantity.

30. The computer program product of claim 28, wherein the computer program code for calculating the daily part index determines the daily part index in accordance with the equation:

$$PI_{D(p,t)} = \left[1 - \frac{\max\left[\left(\sum_{k=-1}^{1} PQ_{(p,t+k-7)} - \sum_{k=-1}^{1} AQ_{(p,t+k)}\right), 0\right]}{\sum_{k=-1}^{1} AQ_{(p,t+k-7)}}\right] \times 100\%,$$

wherein
$PI_{D(p,t)}$ is the daily part index of date t for product p;
t is the date for which the daily part index is being calculated;
p is the product for which the daily part index is being calculated;
$PQ_{(p,t+k-7)}$ is the wafer out quantity sum of product p which is planned to be finished on one week previous of date t according to the production plan; and
$AQ_{(p,t+k)}$ is the wafer out quantity sum of product p which is actually finished in date t.

31. The computer program product of claim 28, further including computer program code for determining a weekly part index based at least in part on the daily part index.

32. The computer program product of claim 31, wherein only daily part index values greater than a first value are used to calculate the weekly part index.

33. The computer program product of claim 31, wherein the computer program code for calculating the weekly part index determines the weekly part index in accordance with the equation:

$$PI_{W_p} = \sum_{t=1}^{tm} \frac{PI_{D(p,t)}}{m},$$

wherein
$PI_{W_p}$ is the weekly part index for product p;
p is the product for which the weekly part index is being calculated;
t is the date for which the weekly part index is being calculated;
$PI_{D(p,t)}$ is the daily part index of date t for product p; and
m is the number of days in one week for which $PI_{D(p,t)}$ is valid.

34. The computer program product of claim 31, further including computer program code for determining a site index based at least in part on the weekly part index.

35. The computer program product of claim 34, wherein the computer program code for determining the site index determines the site index in accordance with the equation:

$$SI_{wf} \% = \frac{\sum_{t=1}^{m} AQ_{(p,t)} \times PI_{W_p} \%}{\sum_{t=1}^{m} AQ_{(p,t)}},$$

wherein
$SI_{wf}\%$ is the site index for week W and fabrication site f;
$AQ_{(p,t)}$ is the wafer out quantity sum of product p that is actually finished on dates t on which $PQ_{(p,t)}$ is valid; and
$PI_{W_p}$ is the weekly part index for product p.

36. The computer program product of claim 28, wherein the first date is the same date as the second date.

* * * * *